US006236771B1

(12) United States Patent
Aoki et al.

(10) Patent No.: US 6,236,771 B1
(45) Date of Patent: May 22, 2001

(54) OPTICAL TRANSMISSION APPARATUS

(75) Inventors: Masahiro Aoki, Kokubunji; Kazuhisa Uomi, Hachioji; Satoshi Aoki, Chigasaki, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/251,662

(22) Filed: Feb. 17, 1999

(30) Foreign Application Priority Data

Jan. 13, 1999 (JP) .................................................. 11-006231

(51) Int. Cl.[7] ...................................................... G02F 1/035
(52) U.S. Cl. ...................................................................... 385/2
(58) Field of Search ............................... 385/2–4, 16, 24, 385/40, 41; 372/45, 46, 50, 96, 48; 359/237, 245, 279, 256, 2

(56) References Cited

U.S. PATENT DOCUMENTS

| | | | | |
|---|---|---|---|---|
| 5,148,503 | * | 9/1992 | Skeie | 385/16 |
| 5,249,243 | * | 9/1993 | Skeie | 385/3 |
| 5,764,670 | * | 6/1998 | Ouchi | 372/45 |
| 5,801,872 | * | 9/1998 | Tsuji | 359/248 |
| 5,978,402 | * | 11/1999 | Matsumoto | 372/45 |

OTHER PUBLICATIONS

2nd Optoelectronics & Communications Conference (OECC 1997) Technical Digest, Jul. 1997, Seoul, Korea, 10C3–1, High Speed (24GHz) and Low–Drive–Voltage (2V) Selectrively.
Grown Integrated Electroabsorption–Modulator/DFB–Laser for WDM Systems, M. Aoki, et al.

* cited by examiner

Primary Examiner—Akm E. Ullah
(74) Attorney, Agent, or Firm—Kenyon & Kenyon

(57) ABSTRACT

An optical transmission apparatus, where the variation of optical wavelength due to temperature change is slight, and at the same time, the stray capacitance of an external modulator is reduced, and an optical integrated structure having a light source and the external modulator is mounted in a mechanically stable manner. The external modulator modulates output light from a semiconductor laser. The semiconductor laser is a front-end emission semiconductor laser that emits unmodulated light. The semiconductor laser and the modulator are monolithically integrated as an integrated structure. Control electrodes of the semiconductor laser and the modulator formed on a waveguide of the integrated structure are junction-down mounted via solder material to a laser-driving electrode and optical-modulator driving electrode separately formed on an optical mounting substrate.

15 Claims, 8 Drawing Sheets

OPTICAL TRANSMISSION APPARATUS

BACKGROUND OF THE INVENTION

1. Field of the Invention

The present invention relates to an optical transmission apparatus, and more particularly, to an optical transmission apparatus comprising an optical device which externally modulates output light from semiconductor laser and an output unit which connects the output from the optical device to a transmission optical fiber, especially applicable to a wavelength-division multiplexing optical communication system to wavelength-multiplex signal light on a plurality of channels and transmit the multiplexed signal light.

2. Description of Related Art

In the wavelength-division multiplexing optical communication, where optical signals of a plurality of wavelengths are wavelength-multiplexed on the same optical transmission line, it is significant to realize high-performance communication techniques and communication optical information processing techniques, and to realize a downsized and economically-advantageous optical transmission apparatus with stabilized operation.

In wavelength-division multiplexing optical communication, it is significant to suppress wavelength variation of a light source of optical transmission apparatus for a long period. At the present time, the frequencies or wavelengths of respective channels used in communication are precisely determined in spacing of 50 to 100 GHz (about 0.4 to 0.8 nm spacing) by international standardization. For this reason, it is important to set the wavelength of semiconductor laser as the light source to the standard in a stable manner.

The wavelength of the output light of the semiconductor laser as the light source is gradually lengthened during a long-period electrification, and wavelength drift of about 0.1 to 0.2 nm occurs after about 20-year life of the communication apparatus. This value, 25 to 50% of the minimum channel wavelength spacing, 0.4 nm, is an extremely large value, and is inappropriate for the light source of a high density wavelength-division multiplexing optical communication apparatus, based on the above-mentioned international standardization. For example, if the minimum channel spacing is 0.4 nm, the amount of wavelength drift must be reduced to ⅛ of the minimum channel spacing, 0.05 nm, or less.

The wavelength stabilization of the light source may be performed by detecting the wavelength of the light source and feedback controlling the result of detection. However, a wavelength monitor and feedback control, necessary for the wavelength stabilization, disturbs downsizing of transmission apparatus and cost reduction. On the other hand, in current communication systems using long-distance line, the transmission speed is mainly 2.6 to 10 Gb/s. Upon construction of an optical transmission apparatus used in such communication system, a modulator must be an external modulator independent of the semiconductor laser. For the purposes of downsizing the optical transmission apparatus and cost reduction by external modulation, an integrated light source with modulator, where an optical modulator is monolithically integrated with semiconductor laser, is desirable.

As means for increasing conventional semiconductor laser output, a method for improving current-light output characteristic of semiconductor laser by so-called junction down mounting, i.e., providing a device function unit of the semiconductor laser to be opposite to a mounting substrate, is known (The Proceeding of the 1994 Institute Autumn Conference C-312 [All MOVPE growth 1.48 $\mu$m deformation MQW-BHLD.]). However, the wavelength stabilization with respect to temperature variation has not been taken into consideration.

The junction down mounting cannot be applied to the above-described light source with modulator where an optical modulator is monolithically integrated with semiconductor laser. That is, to perform modulation in the above-mentioned high-speed transmission, a stray capacitance of the optical modulator must be limited. In the junction down mounting which must limit the capacitance cannot maintain the mechanical strength of the light source. Accordingly, the junction mounting of semiconductor laser where an external modulator is monolithically integrated with the semiconductor laser has been conventionally regarded as impossible.

Note that as a reference about a wavelength-division multiplexing communication system, the Second Optelectronics and Communications Conference (OECC'97) 10C3-1 can be given.

SUMMARY OF THE INVENTION

The main object of present invention is to provide an optical transmission apparatus appropriate to a wavelength-division multiplexing communication system, which has a simple structure, and which can be economically constructed, and operate in a stable manner for a long period, i.e., wavelength variation of its light source is reduced.

Another object of the present invention is to realize, in an optical transmission apparatus using an integrated structure where semiconductor laser is monolithically integrated with an external modulator, means for reducing the capacitance of the external modulator and mounting the integrated structure in a mechanically stable manner.

Still another object of the present invention is to attain the foregoing object, in the optical transmission apparatus using the integrated structure, and realize 0.005 nm/mA or less output wavelength from the semiconductor laser dependent on a control current level.

According to the present invention, the foregoing objects are attained by providing an optical transmission apparatus having an optical integrated structure, comprising semiconductor laser, an external modulator which modulates output light from the semiconductor laser and an optical waveguide which guides output light from the external modulator, wherein the optical integrated structure is junction-down mounted on a mounting substrate, where a driving electrode for the semiconductor laser and a driving electrode for the external modulator are formed separately from each other, by attaching the optical integrated structure to the driving electrode for the semiconductor laser and the driving electrode for the external modulator via solder material.

The above mounting substrate may comprise dielectric material, metal or silicon. The above semiconductor laser preferably is a front-end emission semiconductor laser of distributed feedback type or distributed Bragg reflection type.

Further, the above external modulator, which comprises a waveguide modulator formed on a linear optical waveguide on the integrated structure to guide the output light from the semiconductor laser, reduces the stray capacitance.

Further, according to preferred embodiments, the optical waveguide to guide the output light from the external modulator comprises a waveguide having a function to gradually increase the waveguide modes of modulated light toward a front end for emission.

In the present invention, the wavelength stabilization of the light source is made in consideration of the fact that the above-described optical wavelength variation is caused by increase in Joule heating accompanying increase in driving current applied to the semiconductor laser to attain constant output. By performing so-called junction down mounting to set the device function unit to oppose to the mounting substrate side so as to efficiently radiate Joule heating caused in the laser, heat generation within the chip is prevented, and the amount of wavelength drift is reduced. Especially, the junction down mounting is realized without impairing the low value of capacitance of the optical integrated structure where the external modulator is monolithically integrated with the semiconductor laser. Accordingly, an optical transmission apparatus appropriate to high-density wavelength-division multiplexing optical communication can be realized without any device to feedback control output from a wavelength monitor.

DETAILED DESCRIPTION

First Embodiment

Figure 1:
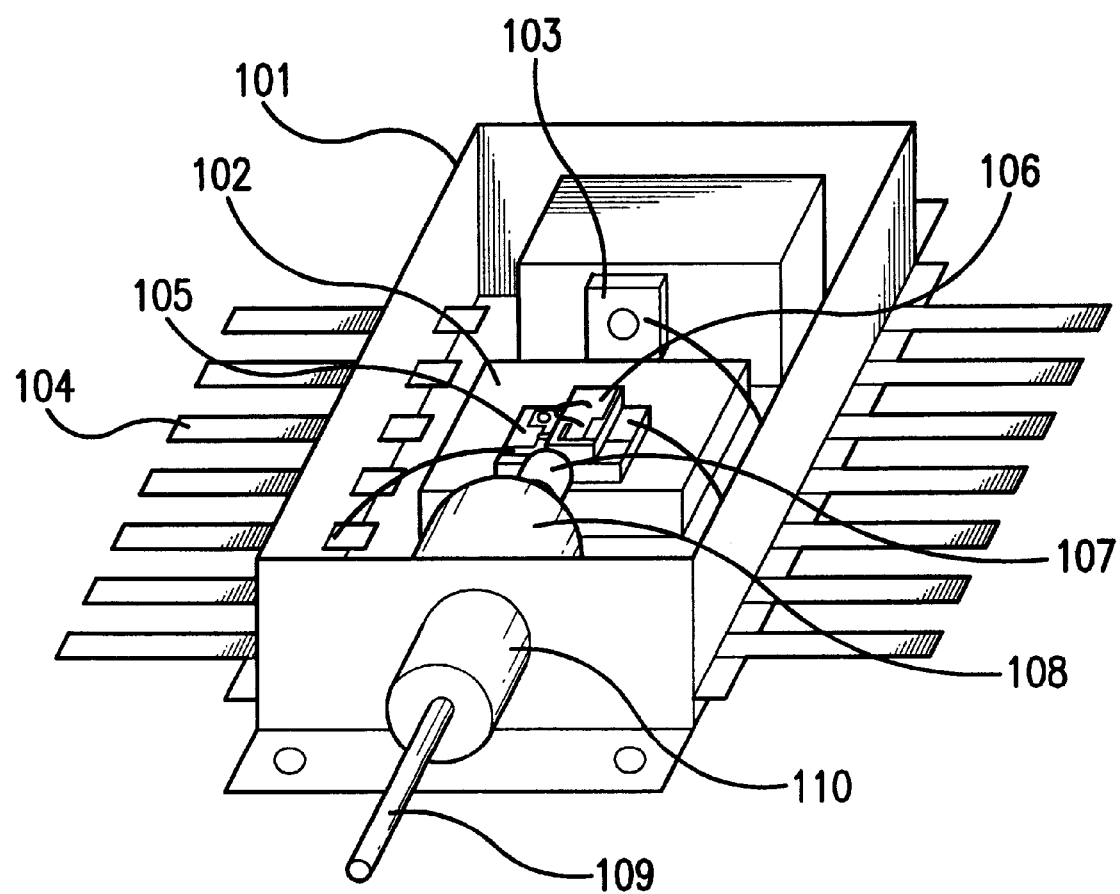
FIG. 1 is a perspective view showing the construction of an embodiment of an optical transmission apparatus according to the present invention.

FIG. 1 is a perspective view showing the construction of an embodiment of an optical transmission apparatus according to the present invention. In the present embodiment, the optical transmission apparatus includes a waveguide type optical modulator for a wavelength of 1.55 mm. As shown in FIG. 1, the optical transmission apparatus comprises a case 101, a temperature controller (heat sink) 102, a monitoring optical receiver device 103, an electrical input terminal 104, an optical mounting substrate 105, a semiconductor optical integrated structure 106, an optical lens 107, an optical isolator 108, an optical fiber 109 and a fiber sleeve 110.

The features of the present embodiment reside in structures of the optical mounting substrate 105 and semiconductor optical integrated structure 106 and mounting of the integrated structure on the substrate. The other constituents have similar constructions to those of conventionally known constituents.

Figure 2:
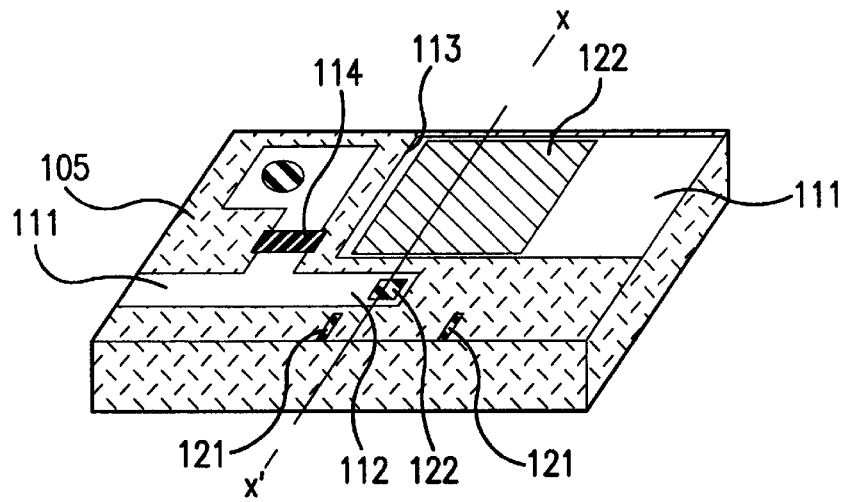
FIG. 2 is an exploded perspective view showing the structure of an optical mounting substrate 105 in FIG. 1.

FIG. 2 is an exploded perspective view showing the structure of the optical mounting substrate 105 in FIG. 1. The optical mounting substrate 105 is made by aluminium nitride material. As shown in FIG. 2, a control electrode 111, comprising a thin film of titanium (Ti)/molybdenum(Mo)/gold(Au) layers, is patterned on the surface of the substrate 105. The control electrode 111 includes an electrode 112 as an electrical input unit to drive the optical modulator, and an electrode 113 as an electrical input unit to drive semiconductor laser. Further, the control electrode 111 includes a region 122 as a solder junction plane. A terminal resistance 114 having an electrical resistance value of 50Ω is formed on the surface of the mounting substrate by a known method. A marker 120 is provided near the region 122 on the end of the surface of the mounting substrate 105.

Figures 3A, 3B:
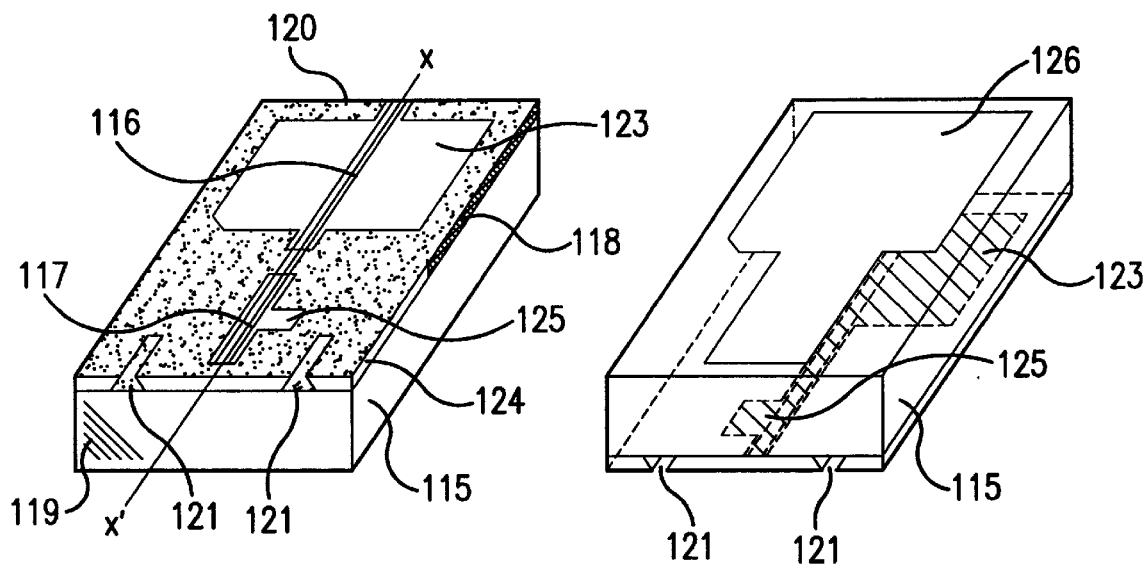
FIGS. 3a and 3b are exploded perspective views showing the structure of a semiconductor optical integrated structure 106 in FIG. 1.

FIG. 3 is a perspective views showing the structure of the semiconductor optical integrated structure 106 in FIG. 1. (a) and (b) respectively show the upper surface (the side facing the mounting substrate 105 upon mounting) and the lower surface of the integrated structure 106. The integrated structure 106 has a multiple quantum well composed of InGaAsP material formed on an Inp substrate 115. The structure has a laser active layer 116, having a light emission peak value of around 1560 nm wavelength band, a modulator absorption layer 117 having a light emission peak value of around 1500 nm wavelength band, and a diffraction grating 118 having Bragg wavelength of 1552 nm and 1.5 to 2 nm stopband width.

Further, a low reflection film 119 having a reflection amount of 0.02% or less is formed on the optical-modulator side end of the optical integrated structure 106, while a high reflection film 120 having a reflection amount of about 90% is formed on the laser side end of the integrated structure 106. Electrodes 123 and 125 are an electrode of the semiconductor laser and that of the optical modulator formed in the semiconductor optical integrated structure 106. The electrodes 123 and 125 are separated from each other. Numeral 124 denotes a semiconductor cladding layer; and 121, markers used upon mounting. A rear surface electrode 126 commonly used for the semiconductor laser and the optical modulator is formed on the lower surface of the integrated structure 106.

Figure 4:
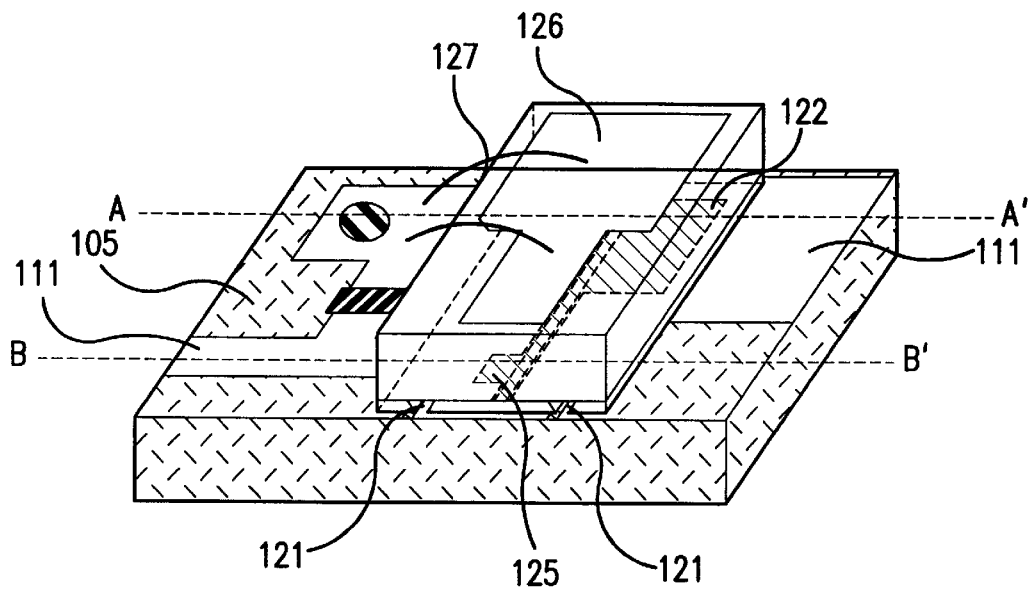
FIG. 4 is a perspective view showing mounting of the semiconductor optical integrated structure 106 on the optical mounting substrate 105 in FIG. 1.

FIG. 4 is a perspective view showing mounting of the semiconductor optical integrated structure 106 on the optical mounting substrate 105 in FIG. 1. In this mounting, the upper surface of the semiconductor optical integrated structure 106, i.e., the surface holding the electrode 122, is junction-down mounted on the upper surface of the mounting substrate 105 in FIG. 2, such that the respective reference lines X–X'coincide with each other, and the electrode 125 of the optical modulator and the electrode 122 on the mounting substrate 105, the semiconductor laser electrode 123 and the solder portion 122 on the mounting substrate 105, correspond to the respective electrode positions. At this time, as a positioning method, well-known method of superimposing infrared transparent images to overlap with each other in image recognition is used with utilizing the positioning markers 121 provided on the surfaces of the mounting substrate 105 and the semiconductor optical integrated structure 106.

Figures 5A, 5B:
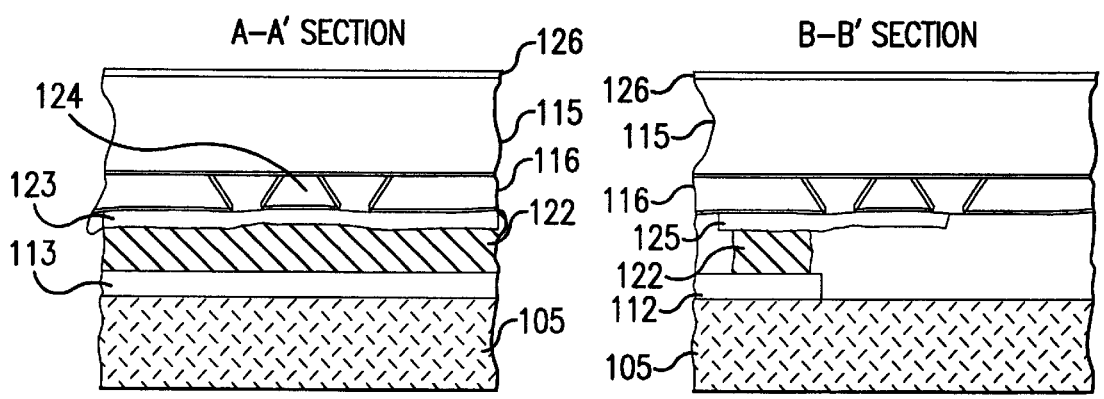
FIGS. 5a and 5b are cross-sectional views respectively cut along lines A–A' and B–B' in FIG. 4.

FIGS. 5 (a) and (b) are cross-sectional views of electrode junction portions respectively cut along lines A–A' and B–B' in FIG. 4. That is, in FIG. 5A cut along the line A–A', the entire electrode surface of the semiconductor-laser driving electrode 113 is closely attached via the gold/tin solder 122 to the semiconductor laser electrode 123 of the semiconductor laser. Accordingly, the Joule heating, caused by current electrification between the rear-surface electrode 126 and the semiconductor-laser driving electrode 113, is efficiently radiated via the semiconductor cladding layer 124 of the semiconductor laser, the electrode 123, the gold/tin solder 122, the semiconductor-laser driving electrode 113 and the optical mounting substrate 105.

On the other hand, B–B' portion is closely attached via the gold/tin solder 122 formed on the tip of the optical-modulator driving electrode 112, having a rectangular shape with a width of 50 µm, to the optical modulator electrode 125. As shown in FIG. 5B, the sum of the thickness of the optical modulator driving electrode 112 and that of the gold/tin solder 122 is 1.5 µm or greater such that a spacing gap of 1.5 µm or greater occurs between a feeder to the optical-modulator driving electrode 112 and a portion, where the optical modulator electrode 125 is not formed, in the surface of the optical modulator.

In the above structure of the optical transmission apparatus, as the soldering portion 122 of the modulator driving electrode 112 formed on an axis X–X' along an optical waveguide has a small area and a constant spacing gap in its peripheral portion, the stray capacitance can be greatly reduced. At the same time, as the soldering portion 122 of the semiconductor-laser driving electrode 113 formed on the axis X–X'becomes wider in a direction across the axis X–X', and has a considerably wide (30 to 50%) area (300 to 500 µm in length and width) with respect to the surface area of the optical integrated structure 106, the semiconductor optical integrated structure 106 can be held on the optical mounting substrate 105 with mechanical stability, although the soldering portion 122 of the modulator control electrode 112 has a small area.

In this embodiment, the thermal resistance value of the laser is 30 K/W or less, which is about ½ of the typical value 60 K/W upon conventional junction up mounting. On the other hand, the stray capacitance of the modulator is reduced to 0.4 pF or less, which is a sufficient value for modulation speed of 10 Gb/s.

The worst value of the dependence $d\lambda p/dIf$ on control current level If of oscillation wavelength $\lambda p$ of the semiconductor laser is obtained from:

$$d\lambda p/dIF = d\lambda p/dT \cdot Rth[Vth + Rs(2IF - Ith)] \quad (1)$$

In this expression, "$d\lambda p/dT$", "Vth", "Rs" and "Ith" respectively denote a temperature coefficient of the oscillation wavelength, an oscillation threshold voltage, device electrical resistance and threshold current, having typical values of 0.1 nm/deg, 1.0 V, 4Ω, and 10 mA, in the present optical transmission apparatus.

Figure 6:
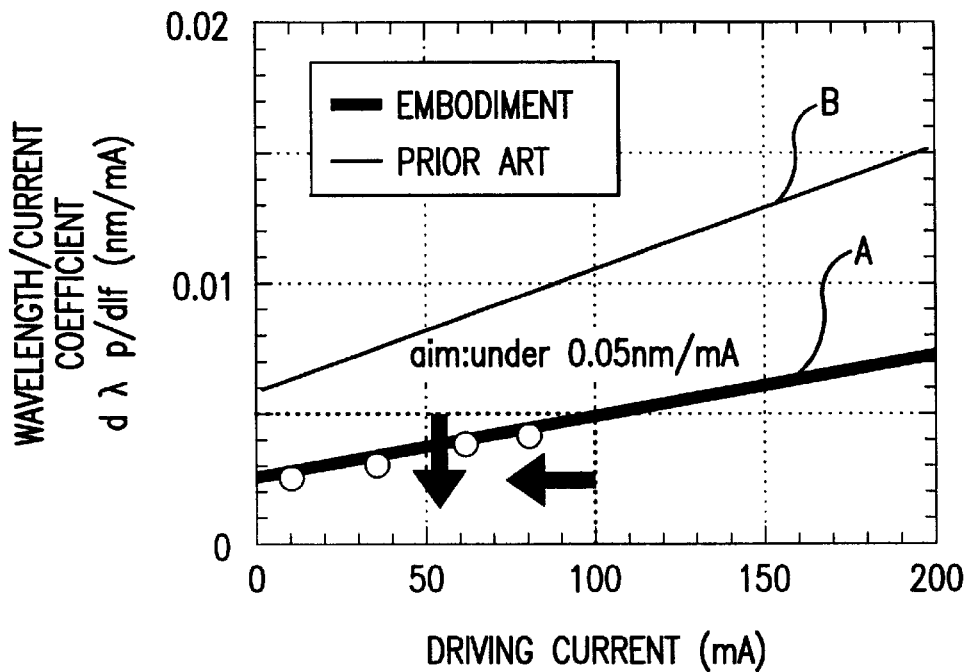
FIG. 6 is a graph showing the result of acquisition of If dependence of $d\lambda p/dIf$ coefficient in a first embodiment.

FIG. 6 is a graph showing estimated values and measured values as the result of acquisition of the If dependence of the $d\lambda p/dIf$ coefficient in the present embodiment. In FIG. 6, a thick line A represents estimated values, and symbols "○", measured values, obtained from the expression (1), where the coefficient $d\lambda p/dT$, the voltage Vth, the resistance Rs and the current Ith have values of 0.1 nm/deg, 1.0 V, 4Ω, and 10 mA. The estimated values and measured values well coincide with each other. Note that a characteristic line B represents estimated values by junction up mounting.

As shown in FIG. 6, the $d\lambda p/dIf$ coefficient increases with the increase of the laser driving current If. If the minimum channel spacing is 0.4 nm, the long-period wavelength drift amount must be reduced to 0.05 nm or less. Assuming that the allowable degradation value of the operating current If in the long-period laser electrification is 10 mA, the necessary value of the $d\lambda p/dIf$ coefficient is 0.005 nm/mA. As shown in FIG. 6, in case of the present optical transmission apparatus, this condition is satisfied when the laser driving current If has a value within a range from 0 to 100 mA, and more practically, from 50 to 80 mA.

As described above, in the optical transmission apparatus of the present embodiment, even if the semiconductor laser as an internal part is time degraded, as the increase in Joule heating due to increase in the driving current can be efficiently radiated, the oscillation wavelength has slight variation. Thus the laser oscillation light with stabilized oscillation wavelength passes through the modulator absorption layer 117 and modulated, then guided via the optical lens 107 and the optical isolator 108 to the optical fiber 109. The modulator, although junction mounted, can follow 10 Gb/s modulation speed by the above described reduced capacitance. Further, as the modulator is an external optical modulator, low chirp modulation is realized at the same time. Accordingly, the simplification of wavelength management, improvement in transmission speed and long-distance transmission can be easily realized in the wavelength-division multiplexing optical communication system.

Note that in the present embodiment, the semiconductor optical mounting substrate 105 comprises aluminium nitride, however, the same advantages can be obtained by using other dielectric and metal materials having excellent thermal conductivity such as artificial diamond, silicon carbide, cubic boron nitride, copper tungsten, copper molybdenum and aluminium siliside.

Second Embodiment

Figure 7:
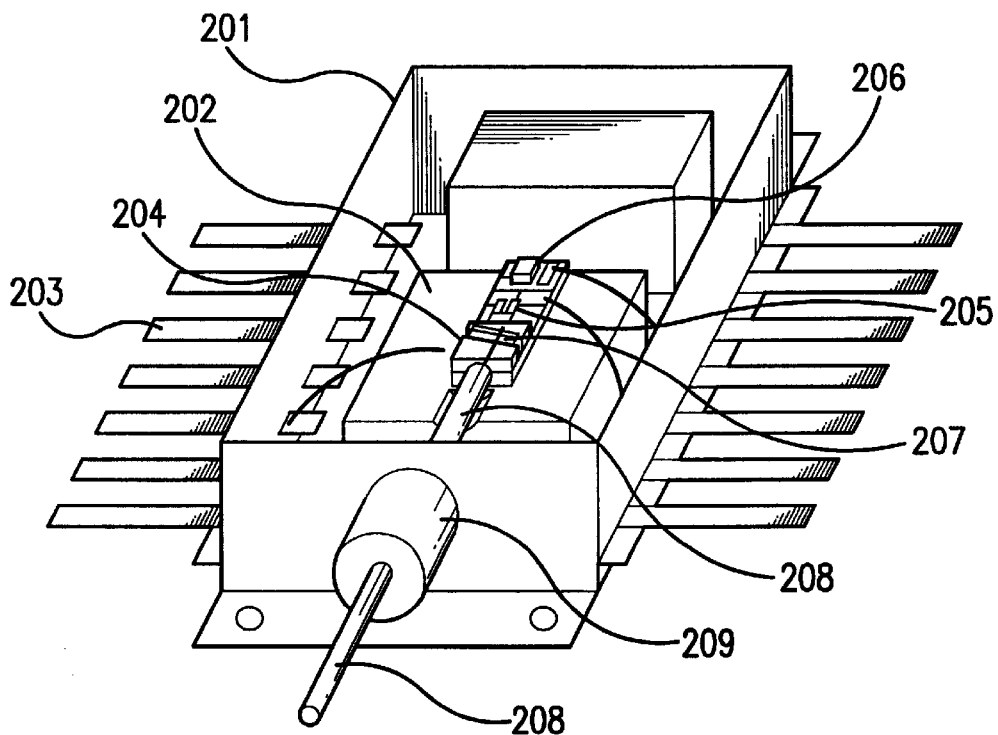
FIG. 7 is a perspective view showing the structure of a second embodiment of the optical transmission apparatus according to the present invention.

FIG. 7 is a perspective view showing the structure of a second embodiment of the optical transmission apparatus according to the present invention. In this embodiment, the optical transmission apparatus includes an optical modulator for a wavelength of 1.55 µm. As shown in FIG. 7, the optical transmission apparatus comprises a case 201, a temperature controller 202, an electrical input line 203, a semiconductor optical mounting substrate 204, a semiconductor optical integrated structure 205, a monitoring optical receiver device 206, a plane optical isolator 207, an optical fiber 208 and a fiber sleeve 209. The case 201, the temperature controller 202, the electrical input line 203, the monitoring optical receiver device 206, the plane optical isolator 207, the optical fiber 208 and the fiber sleeve 209 are manufactured by using known techniques. Hereinbelow, the semiconductor optical mounting substrate 204 and the semiconductor optical integrated structure 205 will be described in detail.

Figure 8:
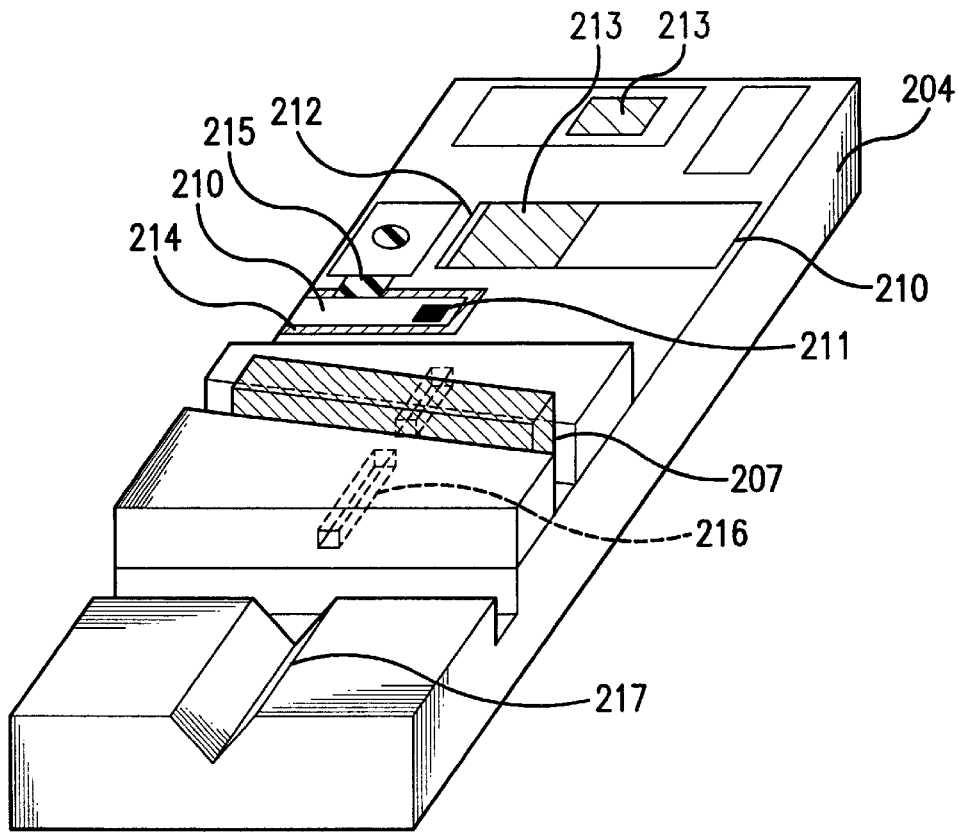
FIG. 8 is an exploded perspective view showing the structure of an optical mounting substrate 205 in FIG. 7.

FIG. 8 is an exploded perspective view showing the structure of the semiconductor optical mounting substrate 204 in FIG. 7. The semiconductor optical mounting substrate 204 comprises conductive silicon semiconductor. A plurality of control electrodes 210 comprising a thin film of titanium(Ti)/molybdenum(Mo)/gold(Au) layers are patterned on the surface of the semiconductor optical mounting substrate 204. The electrodes 210 include a small-area electrode 211, as an electrical input unit to drive the optical modulator, and a large-area electrode 212, as an electrical input unit to drive the semiconductor laser, covered with solder material. The semiconductor-laser driving electrode 212 is directly formed on the conductive silicon semiconductor. On the other hand, the optical modulator driving electrode 211 is formed, via a silicon heat-oxide film 214 having a thickness of 1 $\mu$m for capacitance reduction of the modulator, on the silicon semiconductor substrate 204. The surfaces of the electrodes 211 and 212 are formed by using a known technique such that the heights of these electrodes are the same. A terminal resistance 215 having an electrical resistance value of 50Ω is formed by a known technique on the surface of the substrate 204.

Further, a V groove 217, to mount a quartz-based waveguide 216 to connect optical output from the optical integrated structure 205 to the optical fiber 208, and the optical fiber 208, to correct positions, is formed on the mounting substrate 204.

Figure 9:
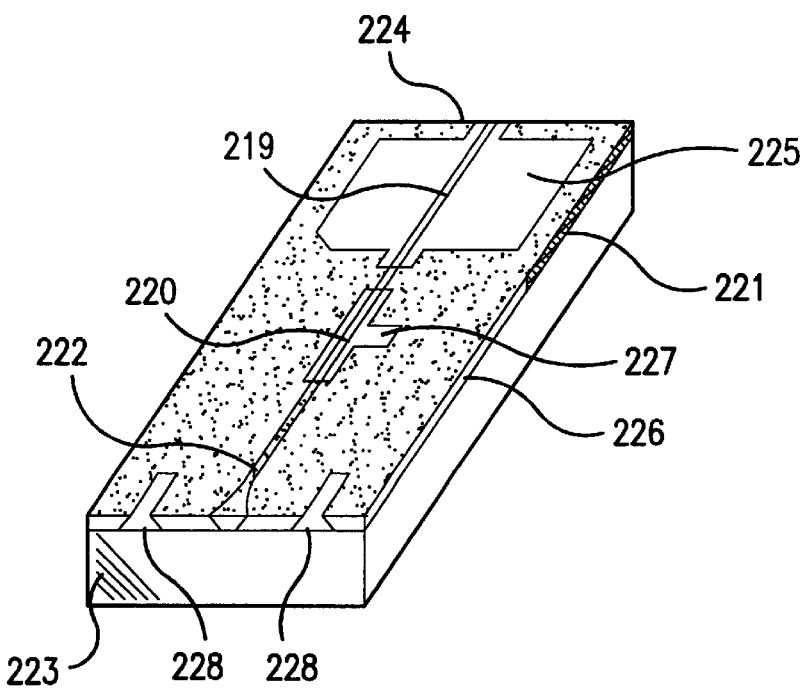
FIG. 9 is a perspective view showing the structure of a semiconductor optical integrated structure 206 in FIG. 7.

FIG. 9 is a perspective view showing the structure of the semiconductor optical integrated structure 205 in FIG. 7. As shown in FIG. 9, the optical integrated structure 205 has a multiple quantum well composed of InGaAsP material formed on an InP substrate 218. The structure has a laser active layer 219, having a light emission peak value of around 1560 nm wavelength band, a modulator absorption layer 220 having a light emission peak value of around 1500 nm wavelength band, a diffraction grating 221 having Bragg wavelength of 1552 nm and 1.5 to 2 nm stopband width, and a spot-diameter enlarging waveguide 222 having an optical emission portion of a structure where the film thickness gradually decreases toward an emission end to enlarge the spot diameter of the waveguide. Further, a low reflection film 223 having a reflection amount of 0.02% or less is formed on the optical-modulator side end of the structure, while a high reflection film 224 having a reflection amount of about 90% is formed on the laser side end of the optical integrated structure 205.

Figure 10:
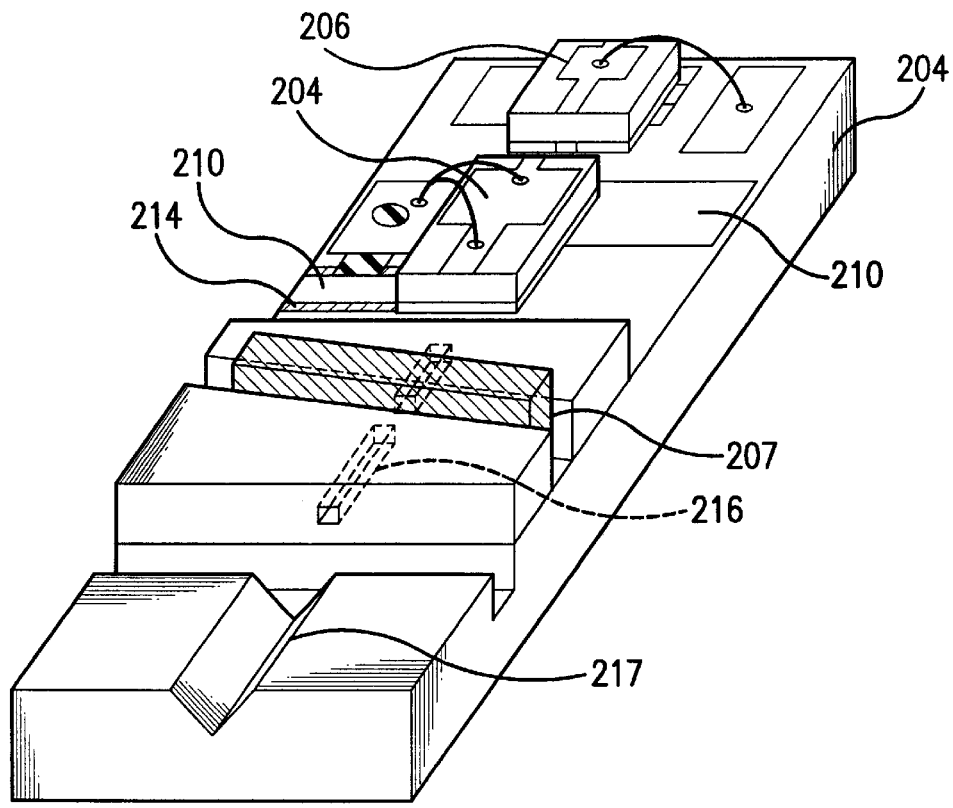
FIG. 10 is a perspective view showing mounting of the semiconductor optical integrated structure 205 in FIG. 7 on the optical mounting substrate 204.

FIG. 10 is a perspective view showing in detail mounting of the semiconductor optical integrated structure 205 on the optical mounting substrate 204. As shown in FIG. 10, the semiconductor optical integrated structure 205 is junction-down mounted on the semiconductor optical mounting substrate 204 such that an electrode 227 of the optical modulator and an electrode 225 of the semiconductor laser respectively coincide with corresponding electrodes on the optical mounting substrate 204 in FIG. 8, i.e., electrode positions of the optical-modulator driving electrode 211 and the semiconductor-laser driving electrode 212. At this time, as a positioning method, well-known method of superimposing infrared transparent images to overlap with each other in image recognition is used with utilizing markers 228 provided on the surfaces of the semiconductor optical mounting substrate 204 and the semiconductor optical integrated structure 205. Similarly to the first embodiment, the entire surface of the semiconductor-laser driving electrode 212 is closely attached via gold/tin solder 213 to the electrode 225 of the semiconductor laser. Accordingly, the Joule heating, caused by current electrification of the semiconductor laser, is efficiently radiated via a semiconductor cladding layer 226 of the semiconductor laser, the electrode 225 of the semiconductor laser, the gold/tin solder 213, the semiconductor-laser driving electrode 212 and the silicon optical mounting substrate 204.

On the other hand, the small-area optical-modulator driving electrode 211 formed 50 by 50 $\mu$m square is closely attached via gold/tin solder to the electrode 227 of the optical modulator. In the present embodiment, the sum of the thickness of the gold/tin solder and that of the electrode conductor 210 of the thin multilayer film is 1.5 $\mu$m or greater such that a spacing gap of 1.5 $\mu$m or greater occurs between a feeder to the optical-modulator driving electrode 211 and a portion, where the electrode 227 of the optical modulator is not formed, in the surface of the optical modulator.

According to the above-described present embodiment, the stray capacitance of the modulator can be reduced, and mechanically stable junction down mounting can be realized. Further, the thermal resistance value of the laser is 30 K/W or less, which is about ½ of the typical value 60 K/W upon conventional junction up mounting. On the other hand, the stray capacitance of the modulator is reduced to 0.4 pF or less, which is a sufficient value for modulation speed of 10 Gb/s.

Figure 11:
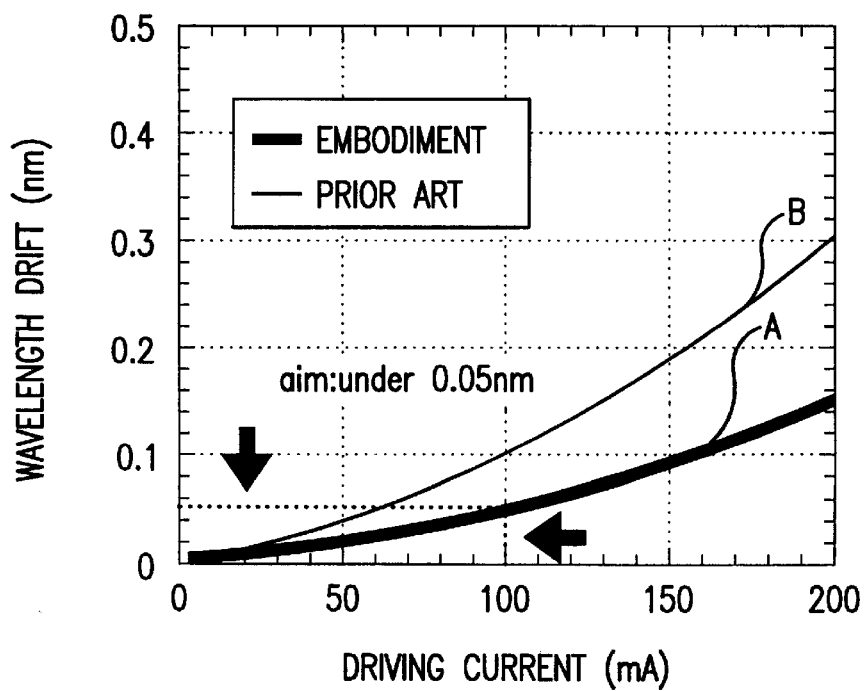
FIG. 11 is a graph showing the result of acquisition of the If dependence of the $d\lambda p/dIf$ coefficient in the second embodiment of the optical transmission apparatus according to the present invention.

FIG. 11 is a graph showing the result of estimation of oscillation wavelength drift amounts of the semiconductor laser in a case where the time degradation of the semiconductor laser of the optical transmission apparatus is controlled so as to obtain constant optical output. In FIG. 11, the vertical axis represents the oscillation wavelength drift amounts, and the horizontal axis, laser-current driving current in initial status. In this figure, lines A and B represent estimated values of oscillation wavelength drift amounts of the second embodiment and the conventional apparatus. The wavelength drift amounts are estimated on the assumption that the initial laser-current driving current of the present embodiment increases by 10%. As shown FIG. 11, the construction of the present embodiment can reduce the wavelength drift amount to 0.05 nm or less with respect to the initial laser driving current up to 100 mA.

As described above, in the optical transmission apparatus of the present embodiment, even if the semiconductor laser as an internal part is time degraded, as the increase in Joule heating due to increase in the driving current can be efficiently radiated, the oscillation wavelength has slight variation. Thus the laser oscillation light with stabilized oscillation wavelength passes through the modulator absorption layer 220 and modulated, then its spot diameter is enlarged by the spot-diameter enlarging waveguide 222, and emitted from the semiconductor integrated structure 204. The emitted light is guided via the quartz-based waveguide 216 formed on the silicon substrate 204 and a junction portion of the plane optical isolator 207, to the optical fiber 208. The modulator, although junction mounted, can follow 10 Gb/s modulation speed by the above-described reduced capacitance. Further, as the modulator is an external optical modulator, low chirp modulation is realized at the same time. Accordingly, the simplification of wavelength management, improvement in transmission speed and long-distance transmission can be easily realized in the wavelength-division multiplexing optical communication system.

Third Embodiment

Figure 12:
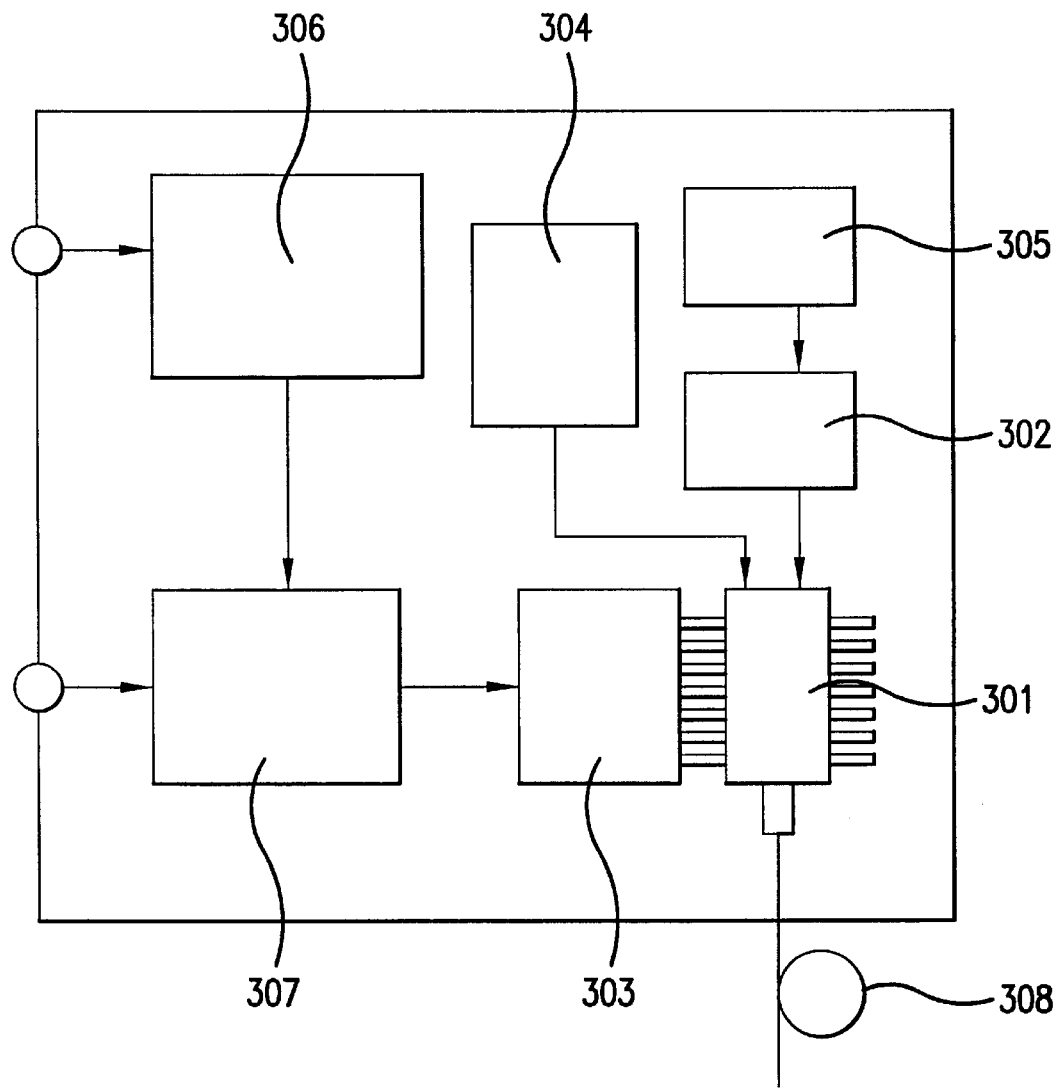
FIG. 12 is a block diagram showing a third embodiment of the optical transmission apparatus according to the present invention.

FIG. 12 is a block diagram showing a third embodiment of the optical transmission apparatus according to the present invention. In the present embodiment, the optical transmission apparatus for a wavelength of 1.55 $\mu$m is manufactured. As shown in FIG. 12, the apparatus comprises an optical transmitting module 301, a laser driving circuit 302, a modulator driver 303, a temperature stabilizing circuit 304, an optical-output stabilizing circuit 305, a clock signal generator 306, a frequency composer 307 and an optical fiber 308. The optical transmission apparatus of the first embodiment or the second embodiment is used as the optical transmitting module 301. The oscillation wavelengths of respective 160 channels are arranged within a range from 1532.29 nm to 1597.19 nm in 0.4 nm spacing. In the construction of the present embodiment, as the long-period drift amount of the respective channel wavelengths of the optical transmission module 301 is 0.05 nm or less, the conventionally-used wavelength stabilizing device to fix oscillation wavelength to a constant value is omitted.

By this simple construction, the optical-wave signal wavelengths of the respective channels can be stabilized with simple means, and a wavelength-division multiplexing optical communication apparatus with increased channel wavelengths and high reliability can be realized at a low cost.

Fourth Embodiment

Figure 13A:
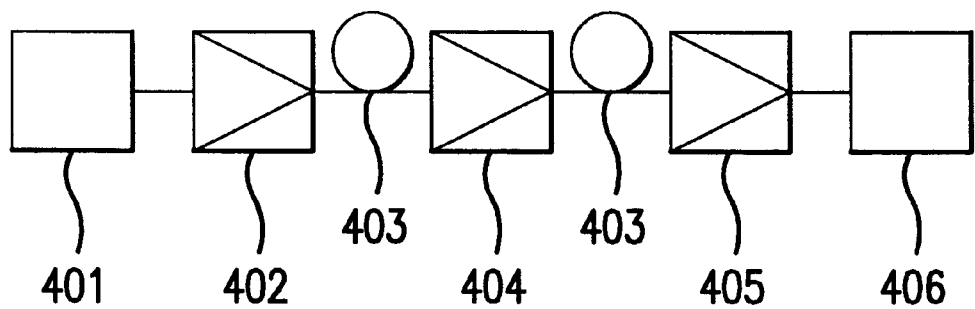
FIGS. 13a and 13b are schematic views showing the construction of a wavelength-division multiplexing optical communication system having the optical transmission apparatus according to the present invention.
Figure 13B:
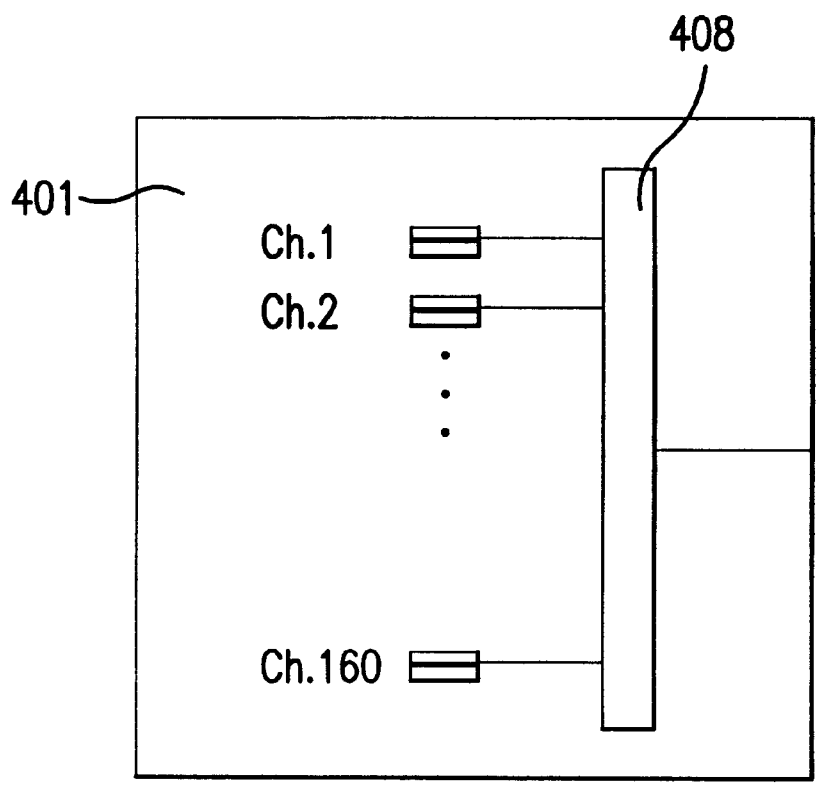

FIGS. 13A and 13B are schematic views showing the construction of a wavelength-division multiplexing optical communication system having the optical transmission apparatus according to the present invention. This system employs a wavelength-division multiplexing optical communication apparatus for a wavelength of 1.55 μm. As shown in FIG. 13A, the present system comprises an optical pre-amplifier 402 which amplifies light from a wavelength-division multiplexing optical transmitter 401, an optical fiber 403 which transmits the output from the optical pre-amplifier 402, an inline amplifier 404, provided in the middle of the optical fiber 403, an optical post-amplifier 405 which receives and amplifies the signal transmitted by the optical fiber 403, and an optical receiver 406 which demultiplexes channels from the signal from the optical post-amplifier 405 and performs decoding to reproduce the signal. FIG. 13B shows the internal construction of the wavelength-division multiplexing optical transmitter 401. The optical transmission apparatus of the first embodiment or the second embodiment is used as a transmission light source 407. The oscillation wavelengths of respective 160 channels are arranged within a range from 1532.29 nm to 1597.19 nm in 0.4 nm spacing. Signal lights from the respective channel light sources are multiplexed in one fiber by using an optical multiplxer 408 using an arrayed grating. In the construction of the present embodiment, as the long-period drift amount of the respective channel wavelengths of the optical transmission apparatus 407 is 0.05 nm or less, the conventionally-used wavelength stabilizing device to fix oscillation wavelength to a constant value is omitted.

According to the optical transmission apparatus and wavelength-division multiplexing optical communication apparatus using the optical transmission apparatus, as the stray capacitance of the external modulator can be reduced by simple junction down mounting, high-quality signal transmission where signal quality between channels is uniformly high can be realized. Further, a highly reliable optical transmission apparatus, where the wavelength of multiplexed signal light does not change even if the semiconductor laser as the transmission light source is time degraded, can be easily provided at a low cost.

The present invention is not limited to the above embodiments and various changes and modifications can be made within the spirit and scope of the present invention. Therefore, to appraise the public of the scope of the present invention, the following claims are made.

What is claimed is:

1. An optical transmission apparatus comprising:
a semiconductor laser,
a waveguide that connects output light from said semiconductor laser to a transmission optical fiber; and
an external modulator, formed on said waveguide, that modulates the output light from said semiconductor laser;
wherein said semiconductor laser, said waveguide and said external modulator are provided, as a semiconductor optical integrated structure, on a single substrate,
and wherein control electrodes for said semiconductor laser and external modulator are fixed to surface electrodes, separately formed on an mounting substrate so as to electrically drive said semiconductor laser and said external modulator independently, via solder material.

2. An optical transmission apparatus comprising:
a semiconductor laser;
a waveguide that connects output light from said semiconductor laser to a transmission optical fiber; and
an external modulator, formed on said waveguide, that modulates the output light from said semiconductor laser;
wherein said semiconductor laser, said waveguide and said external modulator are provided, as a semiconductor optical integrated structure, on a single semiconductor substrate,
and wherein control electrodes for said semiconductor laser and external modulator are fixed to surface electrodes, separately formed on a silicon mounting substrate so as to electrically drive said semiconductor laser and said external modulator independently, via solder material.

3. An optical transmission apparatus comprising:
a semiconductor laser,
a waveguide that connects output light from said semiconductor laser to a transmission optical fiber;
an external modulator, formed on said waveguide, that modulates the output light from said semiconductor laser; and
a connection portion that connects modulated output from said external modulator to an external optical fiber,
wherein said semiconductor laser, said waveguide and said external modulator are provided, as a semiconductor optical integrated structure, on a single silicon semiconductor substrate,
and wherein said waveguide from said external modulator to said connection portion in said semiconductor optical integrated structure is gradually enlarged toward said connection portion in waveguide modes,
further wherein control electrodes for said semiconductor laser and external modulator are fixed to surface electrodes, separately formed on the silicon mounting substrate so as to electrically drive said semiconductor laser and said external modulator independently, via solder material.

4. The optical transmission apparatus according to claim 3, wherein said connection portion comprises a quartz-based waveguide and a plane optical isolator, to collect emitted light from the waveguide of said optical integrated structure and guide the collected light to said transmission optical fiber, and wherein said quartz-based waveguide and said plane optical isolator are formed on said silicon substrate.

5. The optical transmission apparatus according to claim 4, wherein a monitor optical receiving device to monitor the output light from said semiconductor laser is provided on said mounting substrate.

6. The optical transmission apparatus according to claim 4, further comprising an optical system, where output light is guided via an optical lens and an optical isolator to an optical fiber, and a temperature stabilizing device to maintain a constant internal temperature in said semiconductor optical integrated structure.

7. The optical transmission apparatus according to claim 4, further comprising an optical system, where output light is guided via an optical lens and an optical isolator to an optical fiber, a temperature stabilizing device to maintain a constant internal temperature in said semiconductor optical integrated structure constant, and an optical-output stabilizing device to maintain output light from said semiconductor optical integrated structure constant.

8. The optical transmission apparatus according to claim 1, wherein said semiconductor laser is front-end emission semiconductor laser of distributed feedback type or distributed Bragg reflector type.

9. The optical transmission apparatus according claim 1, wherein thermal resistance of said semiconductor laser, when fixed to said mounting substrate, is 30 K/W or less.

10. The optical transmission apparatus according claim 1, wherein dependence of a wavelength of the output light from said semiconductor laser on a driving current level is 0.005 nm/mA or less.

11. The optical transmission apparatus according claim 1, wherein in a state where said external modulator that modulates the output light from said semiconductor laser is fixed via solder material and electrode metal to said mounting substrate, a stray capacitance from the control electrode of said modulator on said mounting substrate to said modulator is 2 pF or less.

12. The optical transmission apparatus according claim 1, wherein in a state where said external modulator that modulates the output light from said semiconductor laser is fixed via solder material and electrode metal to said mounting substrate, a modulation bandwidth of said external modulator is 2.5 GHz or greater.

13. The optical transmission apparatus according claim 1, further comprising positioning markers to align a pattern electrode on said mounting substrate with the control electrode of said external modulator, on said mounting substrate and a device surface side of said optical integrated structure.

14. The optical transmission system, using the optical transmission apparatus in claim 1, in a wavelength-division multiplexing optical communication apparatus that transmits information by propagating an optical wave signal having at least two different wavelengths on one optical transmission line.

15. The optical transmission system that transmits information by propagating an optical wave signal having at least two different wavelengths on one optical transmission line, and that uses the optical transmission apparatus in claim 1, wherein spacing between adjacent channels is 50 to 100 GHz.

* * * * *